United States Patent
Chisaka et al.

(10) Patent No.: US 10,084,374 B1
(45) Date of Patent: Sep. 25, 2018

(54) SEMICONDUCTOR DEVICE

(71) Applicant: Kabushiki Kaisha Toshiba, Minato-ku, Tokyo (JP)

(72) Inventors: Junichi Chisaka, Kawasaki Kanagawa (JP); Kei Kasai, Toshima Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/701,141

(22) Filed: Sep. 11, 2017

(30) Foreign Application Priority Data

Mar. 23, 2017 (JP) .................................. 2017-058069

(51) Int. Cl.
- *H02M 3/07* (2006.01)
- *G05F 3/24* (2006.01)
- *H03K 17/082* (2006.01)

(52) U.S. Cl.
CPC .............. *H02M 3/07* (2013.01); *G05F 3/247* (2013.01); *H03K 17/0822* (2013.01)

(58) Field of Classification Search
CPC ............ G01R 19/165; G01R 19/16504; G01R 19/16519

See application file for complete search history.

(56) References Cited

U.S. PATENT DOCUMENTS

| | | |
|---|---|---|
| 6,559,710 B2 | 5/2003 | Matsuoka |
| 6,933,753 B2 * | 8/2005 | Kuroda ............... H03F 3/45183 327/65 |
| 7,148,724 B2 * | 12/2006 | Oguri .................. H03K 5/2418 326/68 |
| 13,368,429 | 2/2013 | Ueno |

FOREIGN PATENT DOCUMENTS

| | | |
|---|---|---|
| JP | H7-336200 A | 12/1995 |
| JP | 2002-260393 A | 9/2002 |
| JP | 3760104 B2 | 3/2006 |
| JP | 2012-049750 A | 3/2012 |
| JP | 5197691 B2 | 5/2013 |

* cited by examiner

*Primary Examiner* — Jeffrey Zweizig
(74) *Attorney, Agent, or Firm* — White & Case LLP

(57) ABSTRACT

According to embodiments, a semiconductor device includes a first switching element in which a first reference voltage is input to a gate; a second switching element in which a first voltage is input to a gate; a third switching element to which the first switching element is in Darlington connection; a fourth switching element to which the second switching element is in Darlington connection; a first current mirror circuit to regulate currents flowing in the third and fourth switching elements; a fifth switching element switched between ON and OFF states based on a difference between the first reference and the first voltages; a constant current circuit; a second current mirror circuit; and a voltage setting resistance element between a source of the first switching element and a gate of the third switching element or between a source of the second switching element and a gate of the fourth switching element.

9 Claims, 5 Drawing Sheets

US 10,084,374 B1

SEMICONDUCTOR DEVICE

CROSS-REFERENCE TO RELATED APPLICATIONS

This application is based upon and claims the benefit of priority from Japanese Patent Application No. 2017-058069, filed on Mar. 23, 2017; the entire contents of which are incorporated herein by reference.

FIELD

Embodiments of the present invention relate to a semiconductor device.

BACKGROUND

An N-channel MOS (Metal Oxide Semiconductor) transistor is used, for example, as a switching element switching whether or not to supply a current to a load. In such use, a booster circuit may be connected to the gate of the aforementioned MOS transistor. In such a case, when an output voltage of the booster circuit exceeds the gate withstand voltage, the MOS transistor is possibly damaged. Therefore, it is desirable that the output voltage of the booster circuit is controlled to be constant so as not to exceed the gate withstand voltage.

However, in order to control the output voltage of the booster circuit, when elements having electric characteristics depending on temperature, such as diodes, are used, it is concerned that a range of deviation of the output voltage becomes nonstandard.

Embodiments of the present invention provide a semiconductor device capable of performing voltage control which is hardly affected by temperature.

DETAILED DESCRIPTION

Embodiments will now be explained with reference to the accompanying drawings. The present invention is not limited to the embodiments.

First Embodiment

Figure 1:
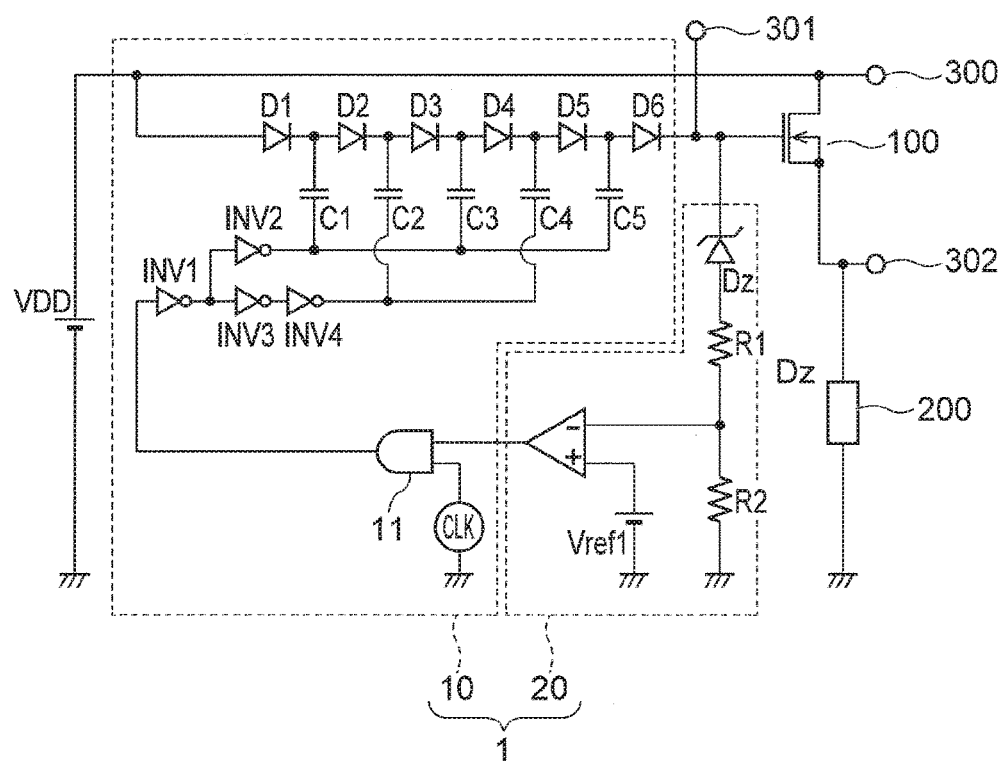
FIG. 1 is a circuit diagram of a semiconductor device according to a first embodiment.

FIG. 1 is a circuit diagram of a semiconductor device according to a first embodiment. A semiconductor device 1 shown in FIG. 1 includes a booster circuit 10 and a comparator 20. The booster circuit 10 and the comparator 20 are connected to a gate of an N-channel MOS transistor 100.

a drain of the N-channel MOS transistor 100 is connected to a power supply terminal 300. A source is connected to a load 200 and an output terminal 302. When the MOS transistor 100 is turned on, a current is supplied to the load 200. When the MOS transistor 100 is turned off, supply of the current to the load 200 is suspended.

The booster circuit 10 is a so-called Dickson charge pump circuit, and includes diodes D1 to D5, capacitors C1 to C5, inverters INV1 to INV4, and an AND circuit 11. The diodes D1 to D5 are connected in series between the power supply terminal 300 and the gate of the MOS transistor 100.

Ends of the capacitors C1 to C5 are respectively connected between the diodes D1 to D5. The other ends of the capacitor C1, C3, and C5 are connected to the output terminal of the inverter INV2 in common. The other ends of the capacitors C2 and C4 are connected to the output terminal of the inverter INV4 in common.

The input terminal of the inverter INV1 is connected to the output terminal of the AND circuit 11. The output terminal of the inverter INV1 is connected to the input terminals of the inverters INV2 and INV3. The output terminal of INV3 is connected to the input terminal of the inverter INV4.

In the booster circuit 10 as described above, an output state of the AND circuit 11 corresponds to an output state of the comparator 20. In accordance with the output state of the AND circuit 11, voltages charged in the capacitors C1 to C5 are added to a power supply voltage "VDD", and input to the gate of the MOS transistor 100.

Figure 2:
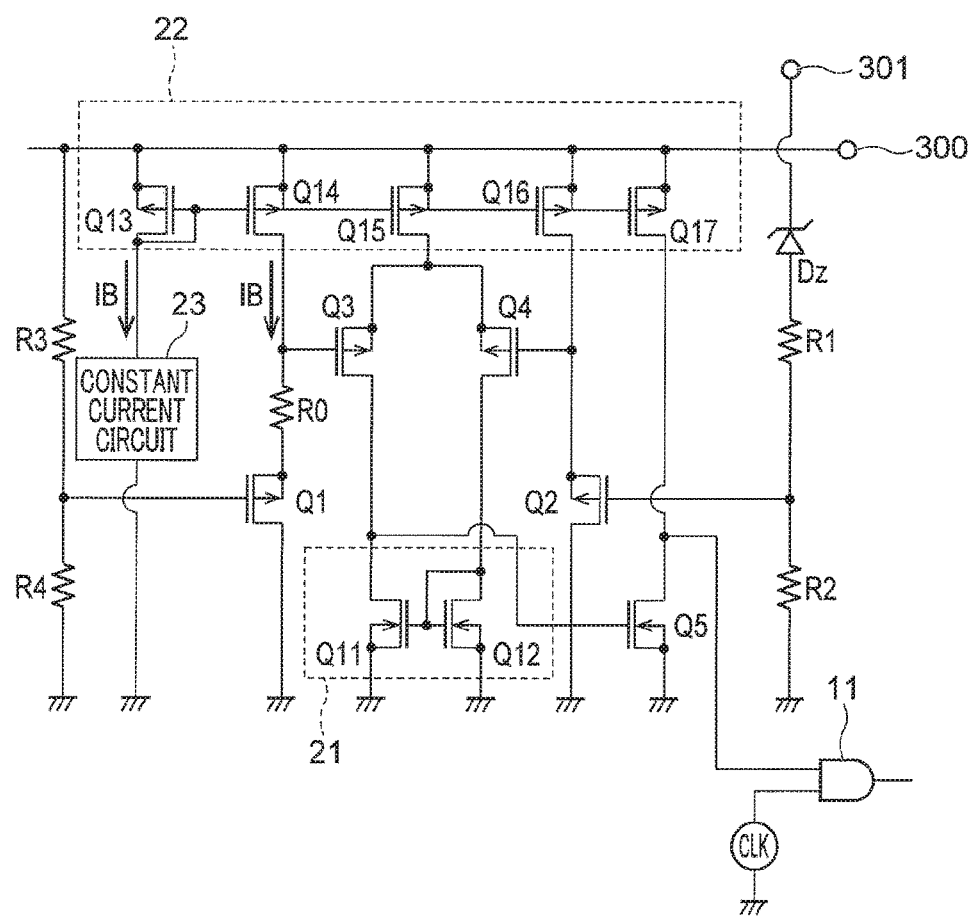
FIG. 2 is a circuit diagram of a comparator according to the first embodiment.

FIG. 2 is a circuit diagram of the comparator 20. The comparator 20 includes switching elements Q1 to Q5, a current mirror circuit 21, a current mirror circuit 22, a constant current circuit 23, resistance elements R0 to R4, and a Zener diode Dz.

The switching elements Q1 to Q5 correspond to a first switching element to a fifth switching element, respectively. The current mirror circuit 21 and the current mirror circuit 22 correspond to a first current mirror circuit and a second current mirror circuit, respectively. The resistance element R0 corresponds to a voltage setting resistance element. The resistance elements R1 to R4 correspond to a first resistance element to a fourth resistance element, respectively.

Moreover, the current mirror circuit 21 includes a switching element Q11 and a switching element Q12. The current mirror circuit 22 includes switching elements Q13 to Q17.

A gate of the switching element Q1 is connected between the resistance element R3 and the resistance element R4. Notably, the resistance element R3 and the resistance element R4 are connected in series between the power supply terminal 300 and a ground terminal. A drain of the switching element Q1 is grounded, and a source is connected to a gate of the switching element Q3 via the resistance element R0. Namely, the switching element Q1 is in Darlington connection to the switching element Q3.

The resistance element R3 and the resistance element R4 are connected in series to the power supply terminal 300. Thereby, the power supply voltage "VDD" is divided by the resistance element R3 and the resistance element R4. The divided voltage is input to the gate of the switching element Q1 as a first reference voltage "Vref1".

The gate of the switching element Q2 is connected between the resistance element R1 and the resistance element R2. Moreover, a drain of the switching element Q2 is grounded, and a source is connected to a gate of the switching element Q4. Namely, the switching element Q2 is in Darlington connection to the switching element Q4.

The resistance element R1 and the resistance element R2 are connected in series along with the Zener diode Dz to an output terminal 301. The output terminal 301 is a terminal for monitoring an output voltage of the booster circuit 10. In the present embodiment, a voltage obtained by subtracting the breakdown voltage of the Zener diode Dz from the output voltage of the booster circuit 10 is divided by the resistance element R1 and the resistance element R2. The divided voltage is input to the gate of the switching element Q2 as a first voltage which is to be compared with the first reference voltage "Vref1".

The sources of the switching element Q3 and the switching element Q4 are connected to the drain of the switching element Q15. A drain of the switching element Q3 is connected to the drain of the switching element Q11. A drain of the switching element Q4 is connected to a drain of the switching element Q12. Notably, while in the present embodiment, the aforementioned switching elements Q1 to Q4 are P-channel MOS transistors, these switching elements may be another type of switching elements, for example, PNP bipolar transistors.

A gate of the switching element Q5 is connected between the drain of the switching element Q3 and the drain of the switching element Q11. A drain of the switching element Q5 is connected to a drain of the switching element Q17 and an input terminal of the AND circuit 11. A source of the switching element Q5 is grounded. By the switching element Q5 switched between the ON state and the OFF state, the output state of the AND circuit 11 changes. Namely, an output of the switching element Q5 corresponds to a control signal of the booster circuit 10.

A gate of the switching element Q11 is connected to a gate and a drain of the switching element Q12. The sources of the switching elements Q11 and Q12 are grounded. The switching element Q11 and the switching element Q12 constitute the current mirror circuit 21. The current mirror circuit 21 regulates the switching elements Q11 and Q12 such that the same currents flow between the drains and the sources of these.

a gate and a drain of the switching element Q13 are connected to the constant current circuit 23 and to the gates of the switching elements Q14 to Q17. The sources of the switching elements Q13 to Q17 are connected to the power supply terminal 300. The switching elements Q13 to Q17 constitute the current mirror circuit 22. The current mirror circuit 22 supplies the constant current "IB" to the switching elements Q1 to Q5.

Figure 3:
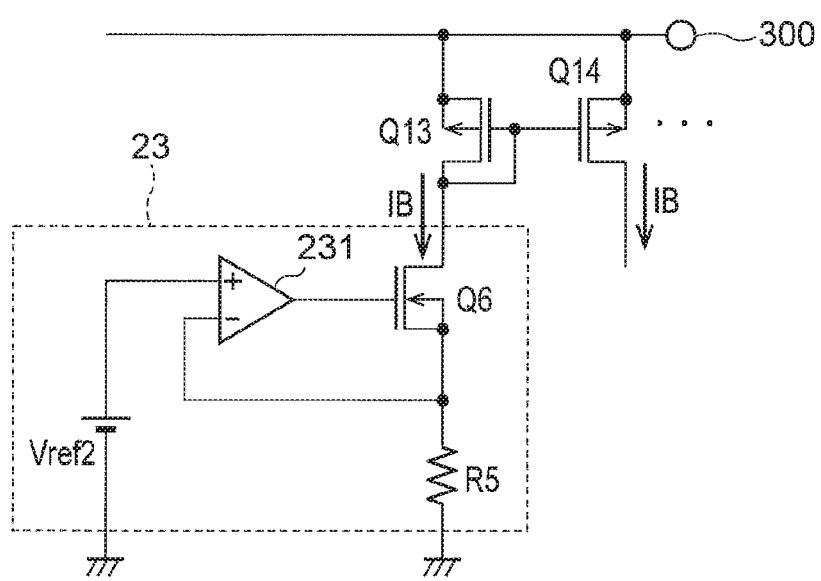
FIG. 3 is a circuit diagram of a constant current circuit.

FIG. 3 is a circuit diagram of the constant current circuit 23. The constant current circuit 23 includes a switching element Q6, a resistance element R5 and a comparator 231. The switching element Q6 corresponds to a sixth switching element. The resistance element R5 corresponds to a current setting resistance element.

A gate of the switching element Q6 is connected to the output terminal of the comparator 231. A drain is connected to the drain of the switching element Q13. A source is grounded via the resistance element R5. The resistance element R5 is formed using the same material as that of the resistance element R0 (see FIG. 2).

To input terminals of the comparator 231, a both-end voltage across the resistance element R5 and a second reference voltage "Vref2" are respectively input. The comparator 231 controls a gate voltage of the switching element Q6 based on a difference between these voltages. Thereby, a source voltage of the switching element Q6 is always controlled so as to be the second reference voltage "Vref2", and the constant current "IB" is generated.

In the aforementioned semiconductor device 1, an output voltage "VCP" of the booster circuit 10 (voltage of the output terminal 301) is set not to exceed the gate withstand voltage of the MOS transistor 100. Here, a setting method of the output voltage "VCP" of the booster circuit 10 is described.

First, a gate voltage "VG1" of the switching element Q1 is calculated. The value of the gate voltage "VG1" corresponds to the value of the first reference voltage "Vref1" obtained by dividing the power supply voltage "VDD" by resistance values "r3" and "r4" of the resistance elements R3 and R4. Therefore, the gate voltage "VG1" can be expressed by the following expression (1).

$$VG1 = VDD \times \frac{r4}{r3 + r4} \tag{1}$$

Next, a gate voltage "VG2" of the switching element Q2 is calculated. The value of the gate voltage "VG2" corresponds to a value obtained by subtracting the breakdown voltage "Vd" of the Zener diode Dz from the output voltage "VCP" of the booster circuit 10 and by dividing the voltage through the subtraction by resistance values "r1" and "r2" of the resistance elements R1 and R2. Therefore, the gate voltage "VG2" can be expressed by the following expression (2).

$$VG2 = (VCP - Vd) \times \frac{r2}{r1 + r2} \tag{2}$$

Next, a source voltage "VS1" of the switching element Q1 is calculated. The source voltage "VS1" corresponds to a value obtained by adding a threshold voltage "Vth1" for the switching element Q1 turned on to the gate voltage "VG1". Therefore, the source voltage "VS1" can be expressed by the following expression (3).

$$VS1 = VG1 + Vth1 \tag{3}$$

Next, a source voltage "VS2" of the switching element Q2 is calculated. The source voltage "VS2" corresponds to a value obtained by adding a threshold voltage "Vth2" for the switching element Q2 turned on to the gate voltage "VG2". Therefore, the source voltage "VS2" can be expressed by the following expression (4).

$$VS2 = VG2 + Vth2 \tag{4}$$

Next, a gate voltage "VG3" of the switching element Q3 is calculated. The gate voltage "VG3" corresponds to a value obtained by adding a both-end voltage across the resistance element R0 (IB×r0) to the aforementioned source voltage "VS1". Therefore, the gate voltage "VG3" can be expressed by the following expression (5).

$$VG3 = VS1 + (IB \times r0) \tag{5}$$

Here, by substituting expressions (1) and (3) for expression (5), the gate voltage "VG3" can be expressed by the following expression (6).

$$VG3 = VDD \times \frac{r4}{r3 + r4} + Vth1 + IB \times r0 \tag{6}$$

Next, a gate voltage "VG4" of the switching element Q4 is calculated. The gate voltage "VG4" equals to the source voltage "VS2" of the switching element Q2. Therefore, by substituting expression (2) for expression (4), the gate voltage "VG4" can be expressed by the following expression (7).

$$VG4 = (VCP - Vd) \times \frac{r2}{r1 + r2} + Vth2 \quad (7)$$

Since the semiconductor device 1 operates such that the gates of the switching elements Q3 and Q4 have the same voltage, VG3=VG4. Moreover, in the present embodiment, since the size of the switching element Q1 is the same as the size of the switching element Q2, Vth1=Vth2. Furthermore, the resistance ratio between the resistance elements R1 and R2 is the same as the resistance ratio between the resistance elements R3 and R4. Therefore, the output voltage "VCP" of the booster circuit 10 can be expressed by the following expression (8).

$$VCP = VDD + Vd + \frac{r1 + r2}{r2} \times (IB \times r0) \quad (8)$$

In the semiconductor device 1, when the output voltage "VCP" of the booster circuit 10 is a threshold voltage, the first voltage which is input to the gate of the switching element Q2 is the same as the first reference voltage "Vref1" which is input to the gate of the switching element Q1. In this stage, since the gate voltage "VG3" of the switching element Q3 equals to the gate voltage "VG4" of the switching element Q4, the operation is stabilized.

Meanwhile, when the output voltage "VCP" of the booster circuit 10 becomes higher or lower than the aforementioned threshold voltage, the comparator 20 operates such that the gate voltage "VG3" becomes equal to the gate voltage "VG4". Hereafter, the content of this operation is described.

When the output voltage "VCP" becomes higher than the threshold voltage, the gate voltage "VG2" of the switching element Q2 rises. As a result, based on expression (4), the source voltage "VS2" of the switching element Q2 rises, and furthermore, the gate voltage "VG4" of the fourth switching element Q4 rises.

With the gate voltage "VG4" rising, the voltage between the gate and the source of the switching element Q4 falls, and the switching element Q4 operates such that it is to be turned off. Therefore, the drain voltage of the switching element Q4 falls, and the gate voltages of the switching element Q11 and the switching element Q12 fall. Thereby, the switching element Q11 is turned off, and hence, the drain voltage of the switching element Q11 rises.

Since with the aforementioned drain voltage rising, the gate voltage of the switching element Q5 rises, the switching element Q5 becomes in the ON state, and the drain voltage of the switching element Q5 becomes at the low level. Thereby, boosting operation of the booster circuit 10 is suspended to reduce the output voltage "VCP".

When, after that, the output voltage "VCP" becomes lower than the threshold voltage, opposite operation to the aforementioned operation is performed, and thereby, the switching element Q5 becomes in the OFF state. In this case, the drain voltage of the switching element Q5 becomes at the high level. Thereby, the operation of the booster circuit 10 is resumed, and the output voltage "VCP" starts to rise. As above, repetition of the boosting operation and the suspension of the booster circuit 10 holds the output voltage "VCP" to be constant.

According to the semiconductor device 1 of the present embodiment described above, for example, when the threshold voltage of the output voltage "VCP" of the booster circuit 10 lacks only with the breakdown voltage "Vd" of the Zener diode Dz, the resistance element R0 is inserted between the switching element Q1 and the switching element Q3. In this case, based on expression (8), the aforementioned threshold voltage can be set higher.

Here, in place of the resistance element R0, a diode can be connected in series to the Zener diode Dz to set the aforementioned threshold voltage to be higher. However, electric characteristics of a diode have higher temperature dependency than those of the resistance element R0. Accordingly, by using the resistance element R0 which has lower temperature dependency in electric characteristics as in the present embodiment, the output voltage "VCP" of the booster circuit 10 is hardly affected by temperature.

Moreover, in the present embodiment, the resistance element R0 is formed using the same material as that of the resistance element R5 of the constant current circuit 23 (see FIG. 3). While the resistance values of resistance elements generally deviate, there is a high possibility that resistance elements with the same material deviate with the same tendency. Therefore, when the resistance element R0 and the resistance element R5 are formed of the same material, even if their resistance values deviate, the both-end voltage across the resistance element R0 (IB×r0) can be made constant.

For example, when resistance values "r0" of resistance elements R0 deviate to be smaller than a setting value, it is expected that both-end voltages (IB×r0) fall. Nevertheless, since resistance values of resistance elements R5 also decrease, constant currents "IB" increase. As a result, the both-end voltages across the resistance elements R0 can be held to be constant.

Accordingly, the output voltage "VCP" of the booster circuit 10 is hardly affected by deviation in production of the resistance elements R0.

Second Embodiment

Figure 4:
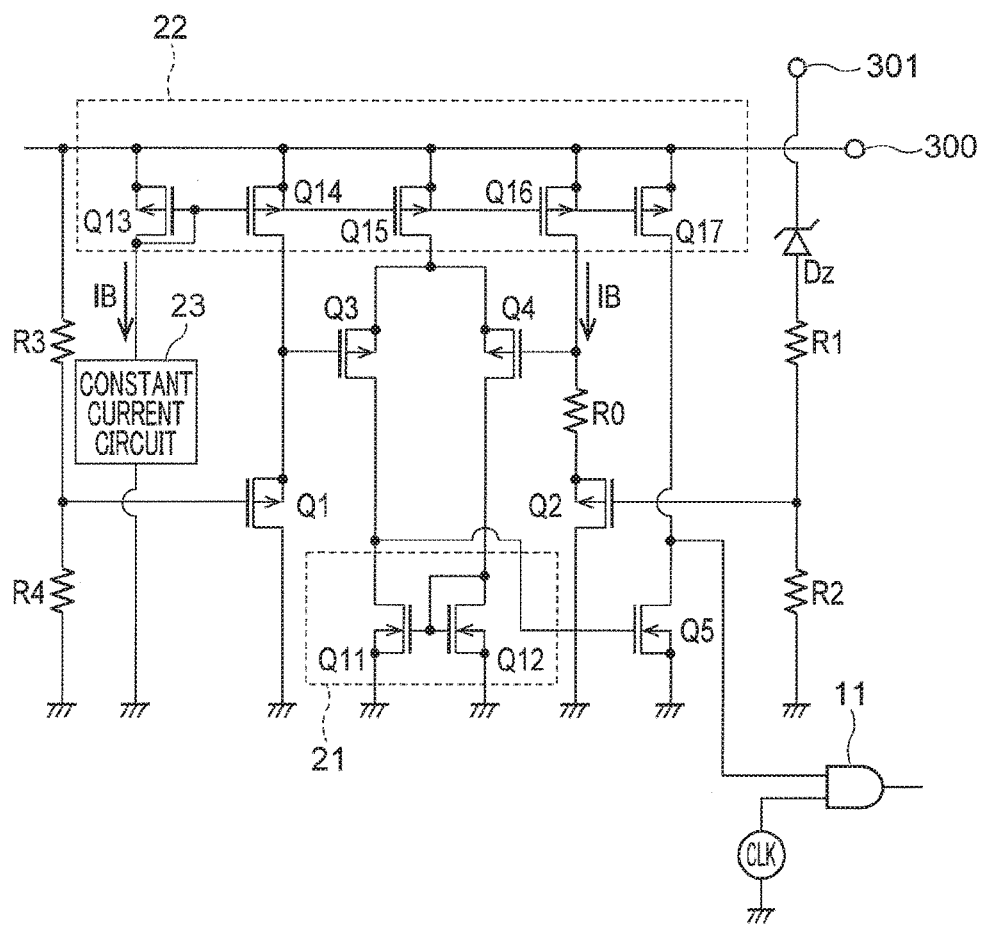
FIG. 4 is a circuit diagram of a comparator according to a second embodiment.

FIG. 4 is a circuit diagram of a comparator according to a second embodiment. The constituents similar to those of the aforementioned first embodiment are given the same signs in FIG. 4, and their detailed description is omitted.

In the first embodiment, the resistance element R0 is provided between the source of the switching element Q1 and the gate of the switching element Q3. Meanwhile, in the present embodiment, as shown in FIG. 4, the resistance element R0 is provided between the source of the switching element Q2 and the gate of the switching element Q4. The output voltage "VCP" of the booster circuit 10 in this case is described below.

In the present embodiment, the gate voltage "VG4" of the switching element Q4 corresponds to a value obtained by adding the both-end voltage across the resistance element R0 (IB×r0) to the source voltage "VS2" of the switching element Q2. Therefore, the gate voltage "VG4" can be expressed by the following expression (9).

$$VG4 = VS2 + (IB \times r0) \quad (9)$$

By substituting expressions (2) and (4) for expression (9), the gate voltage "VG4" is converted into the following expression (10).

$$VG4 = (VCP - Vd) \times \frac{r2}{r1 + r2} + Vth2 + (IB \times r0) \quad (10)$$

Moreover, in the present embodiment, the source voltage "VS1" of the switching element Q1 equals to the gate voltage "VG3" of the switching element Q3. Therefore, the gate voltage "VG3" can be expressed by the following expression (11) using expressions (1) and (3).

$$VG3 = VDD \times \frac{r4}{r3+r4} + Vth1 \qquad (11)$$

Since also in the present embodiment, the semiconductor device 1 operates such that the gates of the switching elements Q3 and Q4 have the same voltage, VG3=VG4. Moreover, similarly to the first embodiment, "Vth1" equals to "Vth2", and the resistance ratio between the resistance elements R1 and R2 is the same as the resistance ratio between the resistance elements R3 and R4. Therefore, the output voltage "VCP" of the booster circuit 10 can be expressed by the following expression (12).

$$VCP = VDD + Vd - \frac{r1+r2}{r2} \times (IB \times r0) \qquad (12)$$

According to the present embodiment described above, for example, when the breakdown voltage "Vd" of the Zener diode Dz is too high as the threshold voltage for the output voltage "VCP" of the booster circuit 10, the resistance element R0 is inserted between the switching element Q2 and the switching element Q4. In this case, based on expression (12), the aforementioned threshold voltage can be set lower. In this stage, by using the resistance element R0 which has low temperature dependency in electric characteristics, the output voltage "VCP" of the booster circuit 10 is hardly affected by temperature.

Third Embodiment

Figure 5:
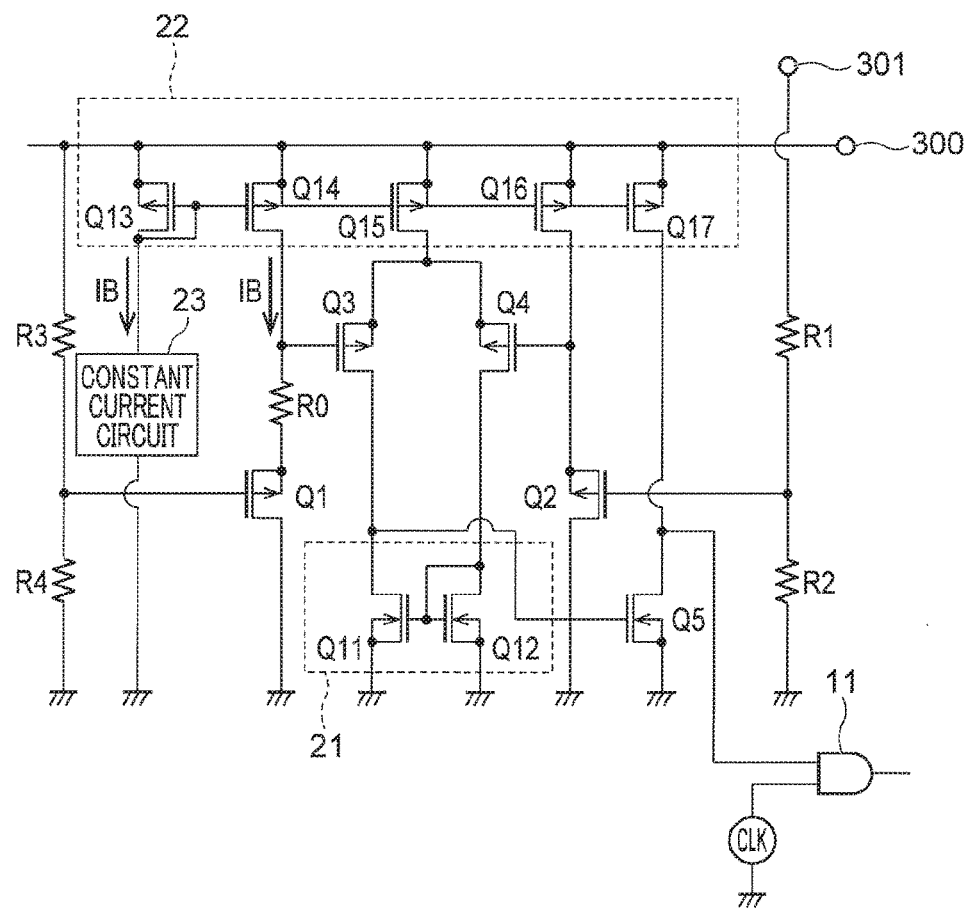
FIG. 5 is a circuit diagram of a comparator according to a third embodiment.

FIG. 5 is a circuit diagram of a comparator according to a third embodiment. The constituents similar to those in the aforementioned first embodiment are given the same signs in FIG. 5, and their detailed description is omitted.

As shown in FIG. 5, the Zener diode Dz is not provided in the comparator according to the present embodiment. Therefore, the first voltage input to the gate of the switching element Q2 is a voltage obtained by dividing the output voltage "VCP" of the booster circuit 10 by the resistance element R1 and the resistance element R2. Accordingly, the output voltage "VCP" of the booster circuit 10 can be expressed by the following expression (13) obtained by removing the breakdown voltage "Vd" from the aforementioned expression (8).

$$VCP = VDD + \frac{r1+r2}{r2} \times (IB \times r0) \qquad (13)$$

According to the present embodiment described above, even without using the Zener diode Dz, the threshold voltage of the output voltage "VCP" of the booster circuit 10 can be set. Thereby, the influence of electric characteristics of the Zener diode Dz caused by temperature change can be eliminated. Accordingly, the output voltage "VCP" of the booster circuit 10 is further hardly affected by temperature.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first switching element in which a first reference voltage is input to a gate;
   a second switching element in which a first voltage being compared with the first reference voltage is input to a gate;
   a third switching element to which the first switching element is in Darlington connection;
   a fourth switching element to which the second switching element is in Darlington connection;
   a first current mirror circuit to regulate currents flowing in the third switching element and the fourth switching element;
   a fifth switching element to be switched between an ON state and an OFF state based on a difference between the first reference voltage and the first voltage;
   a constant current circuit to generate a constant current;
   a second current mirror circuit to supply the constant current to the first switching element and the second switching element; and
   a voltage setting resistance element provided between a source of the first switching element and a gate of the third switching element, or between a source of the second switching element and a gate of the fourth switching element.

2. The semiconductor device according to claim 1, further comprising a booster circuit to change the first voltage based on the ON state and the OFF state of the fifth switching element.

3. The semiconductor device according to claim 2, wherein the booster circuit is connected to a gate of an N-channel MOS transistor switching whether or not to supply a current to a load.

4. The semiconductor device according to claim 2, further comprising:
   a Zener diode connected to an output terminal of the booster circuit;
   a first resistance element and a second resistance element connected in series to the Zener diode; and
   a third resistance element and a fourth resistance element connected in series to a power supply terminal and having the same resistance ratio as a resistance ratio between the first resistance element and the second resistance element, wherein
   the first voltage is a voltage obtained by dividing a voltage obtained by subtracting a breakdown voltage of the Zener diode from an output voltage of the booster circuit by the first resistance element and the second resistance element, and
   the first reference voltage is a voltage obtained by dividing a power supply voltage by the third resistance element and the fourth resistance element.

5. The semiconductor device according to claim 2, further comprising:
   a first resistance element and a second resistance element connected in series to an output terminal of the booster circuit; and a third resistance element and a fourth resistance element connected in series to a power supply terminal and having the same resistance ratio as a resistance ratio between the first resistance element and the second resistance element, wherein the first voltage is a voltage obtained by dividing an output voltage of the booster circuit by the first resistance element and the second resistance element, and the first reference voltage is a value obtained by dividing a power supply voltage by the third resistance element and the fourth resistance element.

6. The semiconductor device according to claim 1, wherein the constant current circuit including:

a sixth switching element connected to the second current mirror circuit;

a current setting resistance element connected in series to the sixth switching element and composed of the same material as that of the voltage setting resistance element; and a comparator to control the sixth switching element based on a difference between a both-end voltage across the current setting resistance element and a second reference voltage for setting the constant current.

7. The semiconductor device according to claim 6, wherein the both-end voltage and the second reference voltage are respectively input to input terminals of the comparator, and a gate of the sixth switching element is connected to an output terminal of the comparator.

8. The semiconductor device according to claim 2, wherein the booster circuit reduces the first voltage when the fifth switching element becomes in the ON state, and raises the first voltage when the fifth switching element becomes in the OFF state.

9. The semiconductor device according to claim 1, wherein a threshold voltage for the first switching element turned on and a threshold voltage for the second switching element turned on are equal to each other.

\* \* \* \* \*